United States Patent
Kitajima

(10) Patent No.: US 9,370,092 B2
(45) Date of Patent: Jun. 14, 2016

(54) MULTILAYER WIRING BOARD

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/490,698

(22) Filed: Sep. 19, 2014

(65) Prior Publication Data
US 2015/0216034 A1 Jul. 30, 2015

(30) Foreign Application Priority Data

Jan. 24, 2014 (JP) .................................. 2014-010967

(51) Int. Cl.
*H05K 1/02* (2006.01)
*H05K 1/11* (2006.01)
*H05K 3/34* (2006.01)

(52) U.S. Cl.
CPC ............ *H05K 1/0224* (2013.01); *H05K 1/0219* (2013.01); *H05K 1/0298* (2013.01); *H05K 1/115* (2013.01); *H05K 1/117* (2013.01); *H05K 3/3457* (2013.01); *H05K 2201/0715* (2013.01); *H05K 2201/099* (2013.01); *H05K 2201/09354* (2013.01); *H05K 2201/09663* (2013.01)

(58) Field of Classification Search
CPC . H05K 1/0224; H05K 1/0219; H05K 1/0298; H05K 1/115; H05K 1/117; H05K 3/3457; H05K 2201/0715; H05K 2201/09354; H05K 2201/09663; H05K 2201/099
See application file for complete search history.

(56) References Cited

U.S. PATENT DOCUMENTS

| 2002/0011659 | A1  | 1/2002  | Nishide et al. |
| 2010/0308118 | A1* | 12/2010 | Kataya ............... H01Q 7/00 235/492 |
| 2011/0217837 | A1* | 9/2011  | Kuratani ............. B81B 7/007 438/612 |

FOREIGN PATENT DOCUMENTS

| JP | 9-213881 A    | 8/1997  |
| JP | 2001-316169 A | 11/2001 |
| JP | 2004-235877 A | 8/2004  |

(Continued)

OTHER PUBLICATIONS

Official Communication issued in corresponding Japanese Patent Application No. 2014-010967, mailed on Jan. 5, 2016.

(Continued)

*Primary Examiner* — Yasser A Abdelaziez
*Assistant Examiner* — Farun Lu
(74) *Attorney, Agent, or Firm* — Keating & Bennett, LLP

(57) ABSTRACT

A multilayer wiring board including a multilayer body including a plurality of insulating layers includes a ground electrode for external connection disposed in a center of a lower surface of the multilayer body, a plurality of individual electrodes at an outer edge of the lower surface of the multilayer body, and a surface insulating film including an interelectrode insulating portion and a surface covering portion, the interelectrode insulating portion covering an edge portion of the ground electrode to provide insulation between the ground electrode and each of the individual electrodes, the surface covering portion being disposed on a surface of a main body of the ground electrode to divide the surface of the main body into a plurality of regions.

18 Claims, 8 Drawing Sheets

(56) References Cited

FOREIGN PATENT DOCUMENTS

| | | | |
|---|---|---|---|
| JP | 2007-295327 | A | 11/2007 |
| JP | 2013-038385 | A | 2/2013 |

OTHER PUBLICATIONS

Official Communication issued in corresponding Japanese Patent Application No. 2014-010967, mailed on Apr. 26, 2016.

* cited by examiner (GROUND ELECTRODE 5: MAIN BODY 5a, EXTENDING PORTION 5b)

MULTILAYER WIRING BOARD

BACKGROUND OF THE INVENTION

1. Field of the Invention

The present invention relates to a multilayer wiring board that includes a plurality of electrodes for external connection, the electrodes being disposed on one principal surface of the multilayer wiring board, and a surface insulating film configured to prevent a short-circuit between adjacent electrodes for external connection.

2. Description of the Related Art

With downsizing of electronic devices, a multilayer wiring board that allows a three-dimensional wiring structure has become widely used as a wiring board for forming an electric circuit for modules mounted on a motherboard of an electronic device (see, e.g., paragraphs [0035] to [0049] and FIG. 1 in Japanese Unexamined Patent Application Publication No. 2013-38385). As illustrated in FIG. 8, a multilayer wiring board 100 of this type is formed by a ceramic multilayer body 102 which is obtained by stacking a plurality of ceramic sheets 101. Each of the ceramic sheets 101 is provided with various wiring electrodes 103a and 103b on one principal surface thereof, and interlayer connection conductors 105 passing through the ceramic sheet 101 in the thickness direction. The wiring electrodes 103a and 103b between layers are connected to each other by the interlayer connection conductors 105.

With further downsizing of modules in recent years, there has been a demand for a reduction in distance between adjacent ones of the wiring electrodes 103a and 103b and between the wiring electrode 103a or 103b and the interlayer connection conductor 105 adjacent to each other. In the multilayer wiring board 100, the outer edge of each of the wiring electrodes 103a and 103b is covered with an insulation covering film 104 to prevent a short-circuit between the wiring electrodes 103a and 103b which are not originally designed to be connected and between the wiring electrode 103a or 103b and the interlayer connection conductor 105.

Each wiring electrode 103a on the upper surface of the multilayer wiring board 100 is used, for example, as an external connection electrode for connection to an external motherboard. In this case, part of the wiring electrode 103a may be used as a ground electrode. For better grounding performance, it is preferable to increase the area of the ground electrode. As the area of the ground electrode increases, however, it becomes difficult to determine an appropriate amount of solder for connection to the motherboard. This results in an increased risk of mounting failure during connection to the motherboard. Therefore, in the related art, a plurality of ground electrodes are formed to ensure mountability of the multilayer wiring board while maintaining the total area of ground electrodes.

The ground electrode described above may be used as a shielding electrode to prevent electromagnetic coupling with the motherboard. However, when a plurality of ground electrodes are formed, a space where there is no electrode is created between ground electrodes. Therefore, to prevent the electromagnetic coupling described above, it is necessary to provide a large-area ground electrode on another ceramic sheet 101. This leads to an increased number of ceramic sheets 101 and makes it difficult to reduce the thickness of the multilayer wiring board 100.

SUMMARY OF THE INVENTION

Preferred embodiments of the present invention provide a thin multilayer wiring board having good mountability to an external motherboard.

A multilayer wiring board including a multilayer body including a plurality of insulating layers stacked on each other, according to a preferred embodiment of the present invention, includes a ground electrode disposed in or approximately in a center of one principal surface of the multilayer body, a plurality of individual electrodes arranged at an outer edge of the one principal surface of the multilayer body, and a surface insulating film including an interelectrode insulating portion and a surface covering portion, the interelectrode insulating portion covering an edge portion of the ground electrode to provide insulation between the ground electrode and each of the individual electrodes, the surface covering portion being disposed on a surface of the ground electrode to divide the ground electrode into a plurality of regions.

In this case, the surface of the ground electrode is divided into a plurality of regions by the surface covering portion of the surface insulating film. The surface covering portion of the surface insulating film is configured such that the area of each of the plurality of regions of the ground electrode is appropriate for connection to an external motherboard. It is thus possible to ensure the same level of mountability as that of the multilayer wiring board of the related art in which a plurality of ground electrodes are arranged.

Since it is not necessary that a plurality of ground electrodes be arranged to ensure mountability to the external motherboard, the ground electrode is preferably used as a shielding electrode to prevent electromagnetic coupling between wiring electrodes on an internal layer and the motherboard. Therefore, unlike the multilayer wiring board of the related art in which a plurality of ground electrodes are provided, it is not necessary to provide a large-area ground electrode on another insulating layer. This reduces the number of insulating layers and makes it possible to provide a thinner multilayer wiring board.

There may be a concern that the ground electrode with a larger area may peel off the insulating layer. However, since the ground electrode is covered by the interelectrode insulating portion of the surface insulating film at the edge portion where the ground electrode may start to peel off, the ground electrode is reliably prevented from peeling off the insulating layer.

The multilayer wiring board may further include a plurality of first interlayer connection conductors connected to the ground electrode, and the first interlayer connection conductors preferably are arranged in a portion of the ground electrode, the portion being covered by the interelectrode insulating portion. In this case, the first interlayer connection conductors are arranged in an edge portion of the ground electrode, the edge portion being covered by the interelectrode insulating portion. As a result, an inside region of the ground electrode, except the edge portion described above, is a region where no first interlayer connection conductors are provided. Therefore, in an insulating layer inside the insulating layer including the ground electrode thereon, the degree of freedom in designing wiring electrodes is increased.

The first interlayer connection conductors are arranged in a portion of the ground electrode, the portion being covered by the interelectrode insulating portion of the surface insulating film and not easily peeling off the insulating layer. This improves connection reliability between the ground electrode and the first interlayer connection conductors.

The first interlayer connection conductors preferably is arranged near an edge of the ground electrode. This increases the area of an inside region of the ground electrode, the inside region being a region where no first interlayer connection conductors are provided. Therefore, in an insulating layer inside the insulating layer having the ground electrode thereon, the degree of freedom in designing wiring electrodes is further increased.

The ground electrode preferably includes a plurality of extending portions each being in a gap between adjacent ones of the individual electrodes, the extending portions extending toward an edge of the one principal surface of the multilayer body. The multilayer wiring board may further include a plurality of second interlayer connection conductors connected to the extending portions. In this case, since the extending portions of the ground electrode and the second interlayer connection conductors are disposed between adjacent ones of the individual electrodes, it is possible to significantly reduce or prevent mutual interference of signals between the individual electrodes.

At least one of the individual electrodes preferably is surrounded by at least one of the first interlayer connection conductors connected to the ground electrode and at least one of the second interlayer connection conductors connected to the ground electrode. This improves isolation characteristics of the individual electrode surrounded by the first interlayer connection conductor and the second interlayer connection conductor.

The multilayer wiring board preferably further includes a predetermined wiring pattern and a capacitive electrode providing a capacitance, the wiring pattern and the capacitive electrode both being disposed inside the multilayer body. Both the wiring pattern and the capacitive electrode preferably are located in a region overlapping the ground electrode in plan view of one principal surface of a predetermined one of the insulating layers. Thus, when the capacitive electrode providing a capacitance between the ground electrode and itself and the wiring pattern for which electromagnetic coupling with the motherboard is to be prevented are both located on one principal surface of the predetermined insulating layer, it is possible to easily reduce the thickness of the multilayer wiring board.

According to preferred embodiments of the present invention, the surface of the ground electrode is divided into a plurality of regions by the surface covering portion of the surface insulating film. The surface covering portion of the surface insulating film is configured such that the area of each of the plurality of regions of the ground electrode is appropriate for connection to an external motherboard. It is thus possible to ensure the same level of mountability as that of the multilayer wiring board of the related art in which a plurality of ground electrodes are arranged.

Since it is not necessary that a plurality of ground electrodes be arranged to ensure mountability to the external motherboard, the ground electrode can be used as a shielding electrode to prevent electromagnetic coupling between wiring electrodes on an internal layer and the motherboard. Therefore, unlike the multilayer wiring board of the related art in which a plurality of ground electrodes are arranged, it is not necessary to provide a large-area ground electrode on another insulating layer. This reduces the number of insulating layers and makes it possible to provide a thinner multilayer wiring board.

There may be a concern that the ground electrode with a larger area may peel off the insulating layer. However, since the ground electrode is covered by the interelectrode insulating portion of the surface insulating film at the edge portion where the ground electrode may start to peel off, the ground electrode is reliably prevented from peeling off the insulating layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
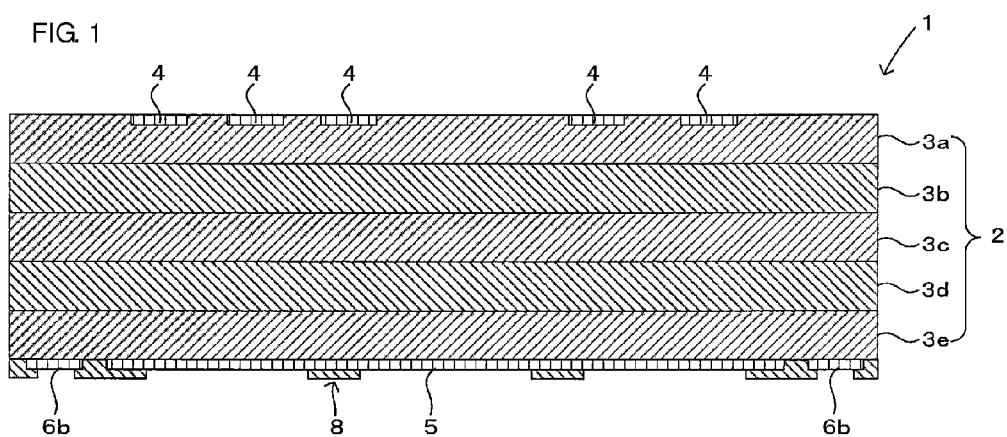
FIG. 1 is a cross-sectional view of a multilayer wiring board according to a first preferred embodiment of the present invention.
Figure 2:
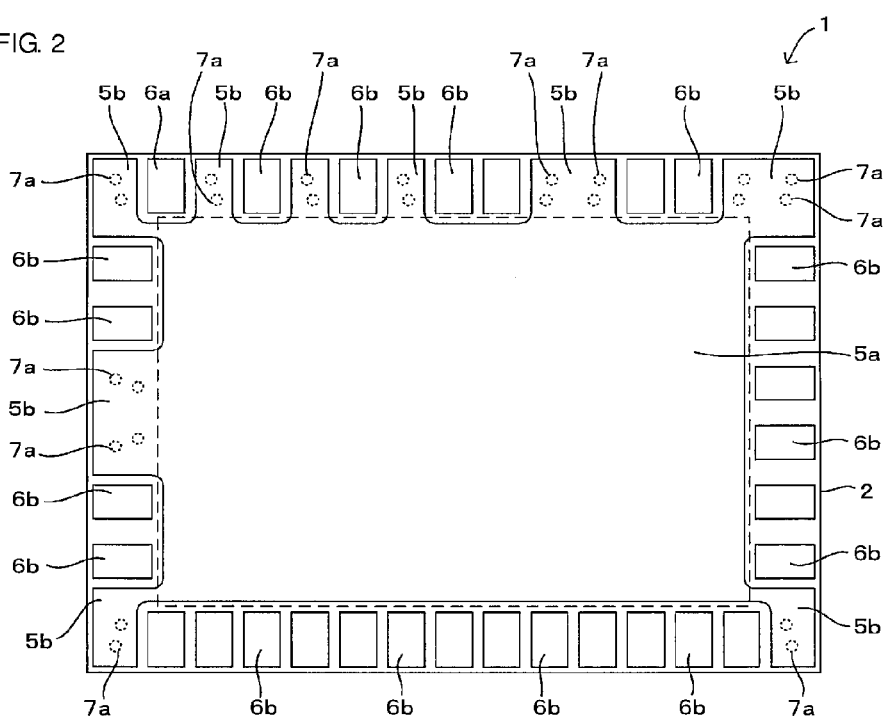
FIG. 2 is a bottom view of the multilayer wiring board of FIG. 1, with a surface insulating film removed.
Figure 3:
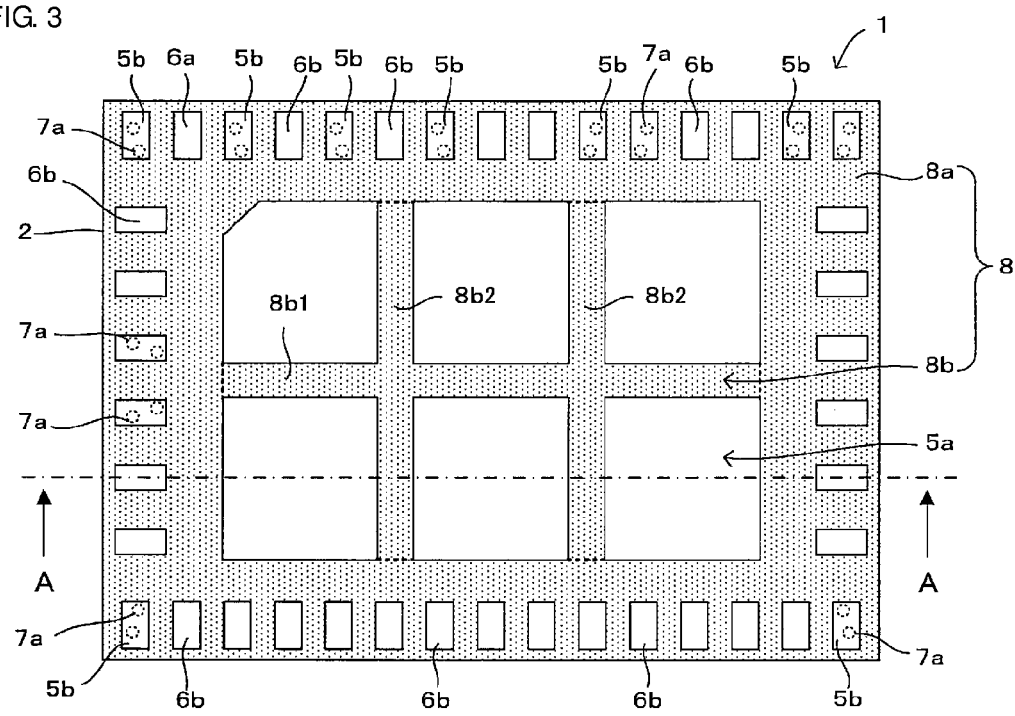
FIG. 3 is a bottom view of the multilayer wiring board illustrated in FIG. 1.
Figure 4:
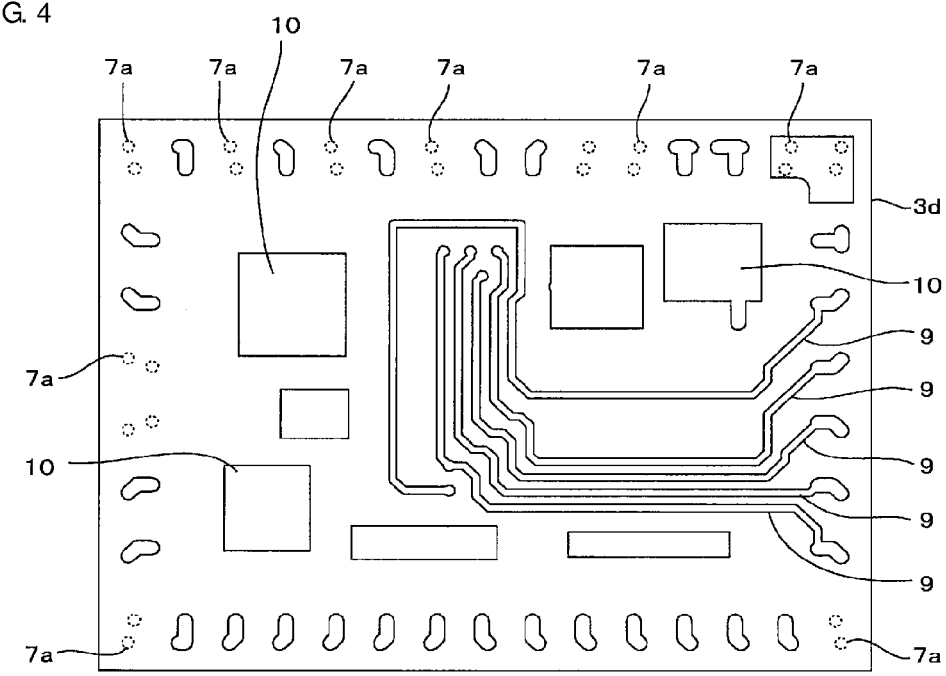
FIG. 4 is a bottom view of the second insulating layer from the bottom of the multilayer wiring board illustrated in FIG. 1.

A multilayer wiring board 1 according to a first preferred embodiment of the present invention will be described with reference to FIGS. 1 to 4. FIG. 1 is a cross-sectional view of the multilayer wiring board 1 according to the first preferred embodiment. FIG. 2 is a bottom view of the multilayer wiring board 1 of FIG. 1, with a surface insulating film 8 removed. FIG. 3 is a bottom view of the multilayer wiring board 1. FIG. 4 is a bottom view of the second insulating layer 3d from the bottom of the multilayer wiring board 1. Note that FIG. 1 is a cross-sectional view as viewed from the direction of arrows A-A of FIG. 3.

As illustrated in FIG. 1, the multilayer wiring board 1 of the first preferred embodiment includes a multilayer body 2 that includes a plurality of insulating layers 3a to 3e (preferably about five layers in the first preferred embodiment, for example) stacked on each other, a plurality of mounting electrodes 4 disposed in the upper surface of the multilayer body to mount components thereon, and a plurality of outer electrodes 5, 6a, and 6b disposed on the lower surface of the multilayer body 2 for external connection. For example, the multilayer wiring board 1 is used as a circuit board to define a high-frequency module circuit mounted on a motherboard of a cellular phone.

As a material of the insulating layers 3a to 3e, a low-temperature co-fired ceramic (LTCC) or glass epoxy resin may preferably be used, for example. In the first preferred embodiment, the insulating layers 3a to 3e are preferably made of a low-temperature co-fired ceramic, for example. Various wiring electrodes and via conductors (not shown in FIG. 1) are disposed inside the multilayer body 2.

The mounting electrodes 4 and the outer electrodes 5, 6a, and 6b are each made of a metal, such as Cu, Ag, or Al. The mounting electrodes 4 are connected, for example, by soldering to respective mounted components. The outer electrodes 5, 6a, and 6b are connected, for example, by soldering to respective connection electrodes on an external motherboard or the like. Although the mounting electrodes 4 are embedded in the insulating layer 3a in FIG. 1, the mounting electrodes 4 preferably are disposed on the principal surface of the insulating layer 3a without being embedded therein.

As described above, the outer electrodes 5, 6a, and 6b are disposed on the lower surface of the multilayer body 2 (corresponding to "one principal surface of the multilayer body" of preferred embodiments of the present invention). That is, the outer electrodes 5, 6a, and 6b are disposed on the lower surface of the lowermost insulating layer 3e. As illustrated in FIG. 2, the outer electrodes 5, 6a, and 6b include a ground electrode 5, and individual electrodes 6a and 6b configured to provide signal transmission and reception and power supply.

Specifically, the ground electrode 5 includes a main body 5a and a plurality of extending portions 5b. The main body 5a is located in or approximately in center of the lower surface of the multilayer body 2. The individual electrodes 6a and 6b are arranged at an outer edge of the lower surface of the multilayer body 2 to surround the main body 5a of the ground electrode 5. Each extending portion 5b of the ground electrode 5 extends, in a gap between predetermined adjacent ones of the individual electrodes 6a and 6b, from the edge of the main body 5a toward the edge of the lower surface of the multilayer body 2. Thus, on the lower surface of the multilayer body 2, the ground electrode 5 is disposed over substantially the entire area, except the regions where there are the individual electrodes 6a and 6b. In FIG. 2, a region surrounded by a broken line indicates the main body 5a of the ground electrode 5.

As illustrated in FIG. 2, a plurality of via conductors 7a are connected to the ground electrode 5. The via conductors 7a are disposed in the extending portions 5b located outside the main body 5a of the ground electrode 5. The via conductors 7a connected to the extending portions 5b correspond to "second interlayer connection conductors" of preferred embodiments of the present invention. Instead of each via conductor 7a, for example, a pin-shaped conductor preferably formed by processing a wire rod of a metal, such as Cu, Ag, or Al, into a predetermined length may be used. Via conductors (not shown) are connected to some of the individual electrodes 6a and 6b.

As illustrated in FIG. 3, a surface insulating film 8 is disposed on the lower surface of the multilayer body 2. The surface insulating film 8 is configured to prevent a short-circuit between adjacent ones of the outer electrodes 5, 6a, and 6b, and also to optimize the area of connection of the outer electrodes 5, 6a, and 6b to the outside. The surface insulating film 8 is indicated by a dotted area in FIG. 3. The surface insulating film 8 is applied, for example, preferably by a printing technique using ceramic paste or solder resist (ceramic paste in the first preferred embodiment), to the lower surface of the multilayer body 2 where there are the outer electrodes 5, 6a, and 6b.

Specifically, the surface insulating film 8 includes an interelectrode insulating portion 8a and a surface covering portion 8b. The interelectrode insulating portion 8a covers an edge portion of the ground electrode 5 to provide insulation between the ground electrode 5 and each of the individual electrodes 6a and 6b. The surface covering portion 8b is disposed on the surface of the main body 5a of the ground electrode 5 to divide the main body 5a into a plurality of regions (for example, about six regions in the first preferred embodiment). Broken lines in the dotted area in FIG. 3 each indicate a boundary between the interelectrode insulating portion 8a and the surface covering portion 8b.

The interelectrode insulating portion 8a covers the outer edge (edge portion) of the main body 5a of the ground electrode 5, the outer edge of each extending portion 5b, the outer edge of each of the individual electrodes 6a and 6b, and the lower surface of the multilayer body 2 between adjacent ones of the outer electrodes 5, 6a, and 6b. The interelectrode insulating portion 8a is thus interposed between adjacent ones of the outer electrodes 5, 6a, and 6b to provide insulation therebetween.

As illustrated in FIG. 3, the surface covering portion 8b has a pattern shape defined by a combination of a horizontally extending strip pattern 8b1 and about two vertically extending strip patterns 8b2. The horizontally extending strip pattern 8b1 passes along substantially the center in the vertical direction of the horizontally long, substantially rectangular main body 5a of the ground electrode 5, and extends in a direction parallel or substantially parallel to the long-side direction of the main body 5a. The vertically extending strip patterns 8b2 are perpendicular or substantially perpendicular to the horizontally extending strip pattern 8b1. By covering the surface of the main body 5a with this pattern shape, the surface covering portion 8b divides the surface of the main body 5a into preferably about six rectangular or substantially rectangular electrode-exposed regions having the same or substantially the same area, for example. The area of each electrode-exposed region is set such that when the multilayer wiring board 1 is connected by soldering to an external motherboard, an appropriate solder connection to the corresponding connection electrode on the motherboard is achieved. The pattern shape of the surface covering portion 8b described above is merely an example, and can be changed appropriately, as long as the ground electrode 5 is divided into a plurality of regions. Also, the shape of each electrode-exposed region is not limited to a rectangular or substantially rectangular shape, and may be, for example, a circular or substantially circular shape.

In the first preferred embodiment, the via conductors 7a connected to the ground electrode 5 are preferably located in the extending portions 5b of the ground electrode 5. Thus, a large empty space is created in the center or approximate center of the lower surface of the insulating layer 3d immediately above the lowermost insulating layer 3e (i.e., in the region overlapping the main body 5a of the ground electrode 5 in plan view). Therefore, as illustrated in FIG. 4, in this empty space, a predetermined plurality of wiring patterns 9 and a plurality of capacitive electrodes 10 providing a capacitance between the ground electrode 5 and themselves are disposed on the lower surface of the insulating layer 3d. The capacitive electrodes 10 and the wiring pattern 9 (wiring pattern) are substantially entirely disposed in the region overlapping the main body 5a of the ground electrode 5 in plan view of the lower surface of the insulating layer 3d. Thus, when the multilayer wiring board 1 is mounted on an external motherboard, it is possible to prevent electromagnetic coupling between the motherboard and the wiring pattern 9.

A non-limiting example of a method for manufacturing the multilayer wiring board 1 will now be described. In this method for manufacturing the multilayer wiring board 1, first, the insulating layers 3a to 3e are individually prepared. For example, in the preparation of the lowermost insulating layer 3e, a ceramic green sheet to define the insulating layer 3e is prepared. Then, via holes are formed preferably by irradiating, with laser light, predetermined points on one principal surface of the ceramic green sheet.

Next, for example, by using a printing technique, the via holes are filled with conductive paste containing a metal (e.g., Cu, Ag, or Al) or an organic solvent, so as to form the via conductors 7a in the lowermost insulating layer 3e.

Next, the outer electrodes 5, 6a, and 6b made of a metal, such as Cu, Ag, or Al, are formed on the lower surface of the insulating layer 3e by using a printing technique or the like.

After formation of the outer electrodes 5, 6a, and 6b, the surface insulating film 8 is formed on the lower surface of the insulating layer 3e, so that the insulating layer 3e is completed. The surface insulating film 8 can be formed by applying ceramic paste to the lower surface of the insulating layer 3e using a printing technique.

The other insulating layers 3a to 3d are prepared in a similar manner. As in the case of forming the outer electrodes 5, 6a, and 6b, a printing technique can be used to form the mounting electrodes 4 in the upper surface of the uppermost insulating layer 3a and various wiring electrodes, including the wiring pattern 9 and the capacitive electrodes 10, on the lower surface of the second insulating layer 3d from the bottom of the multilayer wiring board 1.

Next, the insulating layers 3a to 3e prepared as described above are stacked in a predetermined order and pressure-bonded together to form the multilayer body 2 including the stacked insulating layers 3a to 3e.

Last, the multilayer body 2 under pressure is fired at a predetermined temperature (e.g., about 850° C.) to complete the multilayer wiring board 1.

In the first preferred embodiment, the surface of the main body 5a of the ground electrode 5 in the center of the lower surface of the multilayer body 2 is divided into about six electrode-exposed regions, for example, by the surface covering portion 8b of the surface insulating film 8. The area of each electrode-exposed region of the main body 5a is set such that when the multilayer wiring board 1 is connected by soldering to an external motherboard, an appropriate solder connection to the corresponding connection electrode on the motherboard is achieved. Therefore, it is possible to ensure the same level of mountability as that of the multilayer wiring board of the related art in which a plurality of ground electrodes are arranged.

Since it is not necessary that a plurality of ground electrodes be arranged to ensure mountability to the external motherboard, the ground electrode 5 preferably is used as a shielding electrode to prevent electromagnetic coupling between wiring electrodes, such as the wiring pattern 9, on an internal layer and the motherboard. Therefore, unlike the multilayer wiring board of the related art in which a plurality of ground electrodes are arranged, it is not necessary to provide a large-area ground electrode on another insulating layer. This reduces the number of insulating layers 3a to 3e and makes it possible to provide a thinner multilayer wiring board.

There may be a concern that the ground electrode 5 with a larger area may peel off the insulating layer 3e. However, since the ground electrode 5 is covered by the interelectrode insulating portion 8a of the surface insulating film 8 at the edge portion where the ground electrode 5 may start to peel off, the ground electrode 5 is prevented from peeling off the insulating layer 3e.

The ground electrode 5 includes the extending portions 5b each being in a gap between predetermined adjacent ones of the individual electrodes 6a and 6b. The extending portions 5b extend toward the edge of the lower surface of the multilayer body 2. The via conductors 7a connected to the ground electrode 5 are located in the extending portions 5b. This prevents mutual interference of signals between the individual electrodes 6a and 6b provided with the extending portions 5b therebetween.

Since the via conductors 7a connected to the ground electrode 5 are located in the extending portions 5b of the ground electrode 5, a large empty space is created in the center of the lower surface of the insulating layer 3d immediately above the lowermost insulating layer 3e (i.e., in the region overlapping the main body 5a of the ground electrode 5 in plan view). This increases the degree of freedom in designing various wiring electrodes (e.g., the wiring pattern 9 and the capacitive electrodes 10) on the lower surface of the insulating layer 3d.

In the first preferred embodiment, the capacitive electrodes 10 and the wiring pattern 9 are disposed on the lower surface of the insulating layer 3d by using the large empty space. This makes it easier to reduce the thickness of the multilayer wiring board 1.

Second Preferred Embodiment

Figure 5:
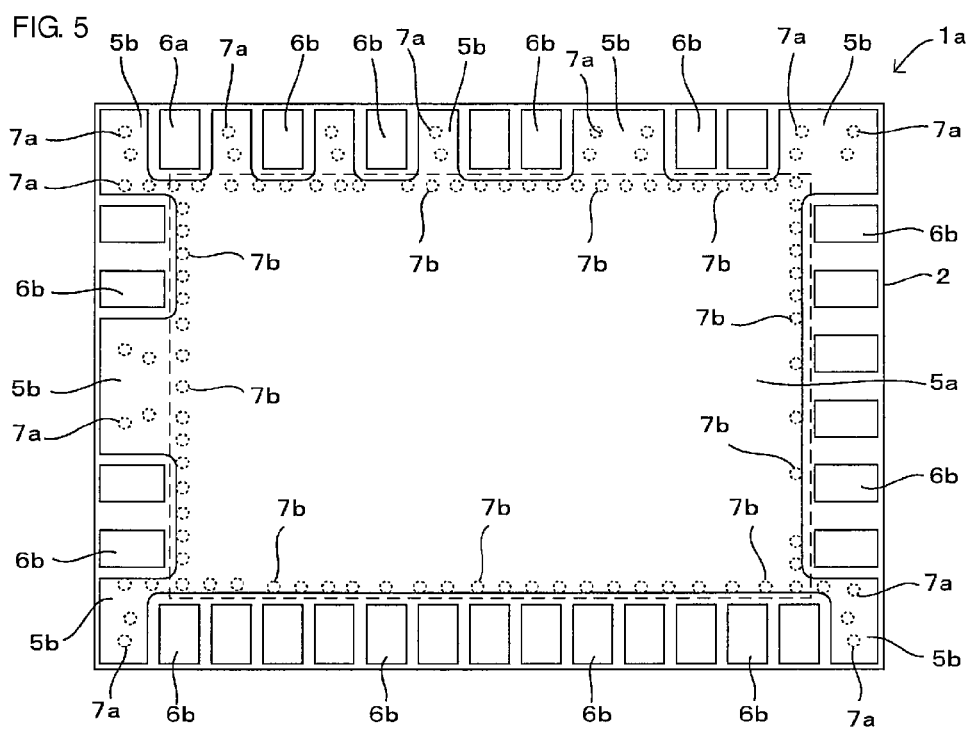
FIG. 5 is a bottom view of a multilayer wiring board according to a second preferred embodiment of the present invention, with the surface insulating film removed.
Figure 6:
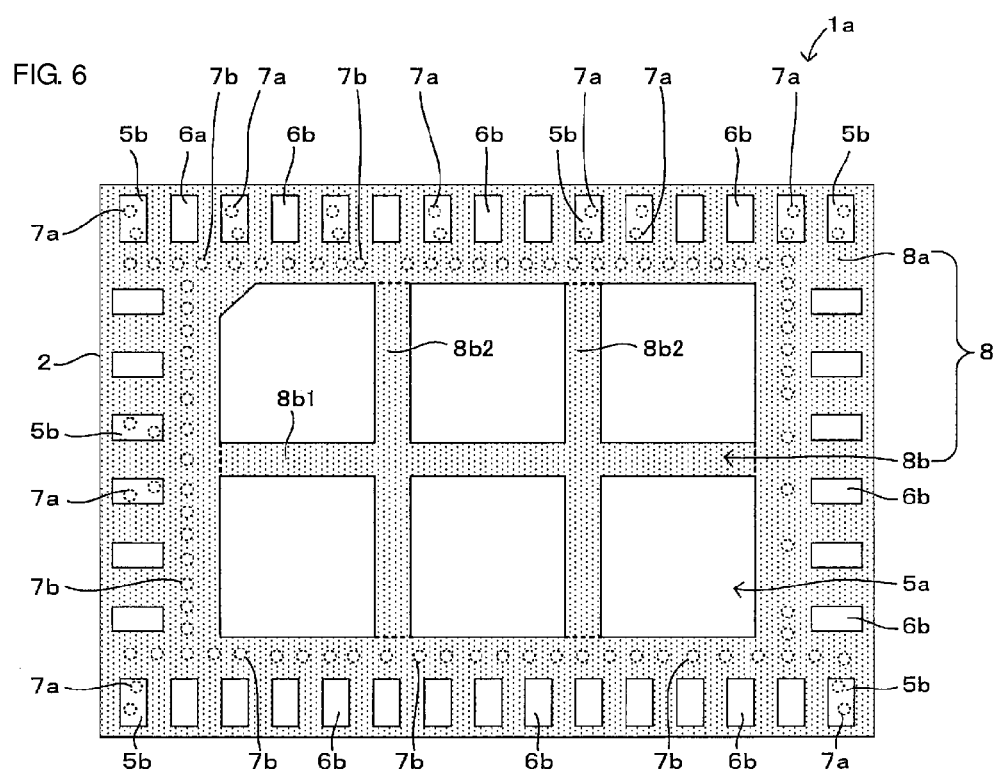
FIG. 6 is a bottom view of the multilayer wiring board illustrated in FIG. 5.
Figure 7:
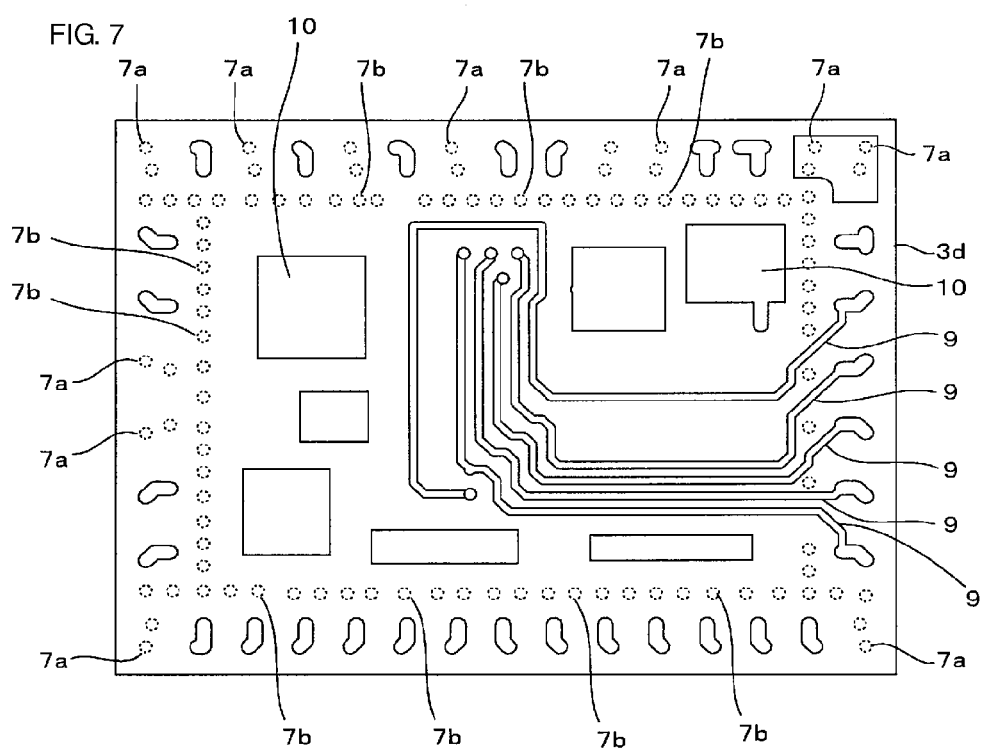
FIG. 7 is a bottom view of the second insulating layer from the bottom of the multilayer wiring board illustrated in FIG. 5.
Figure 8:
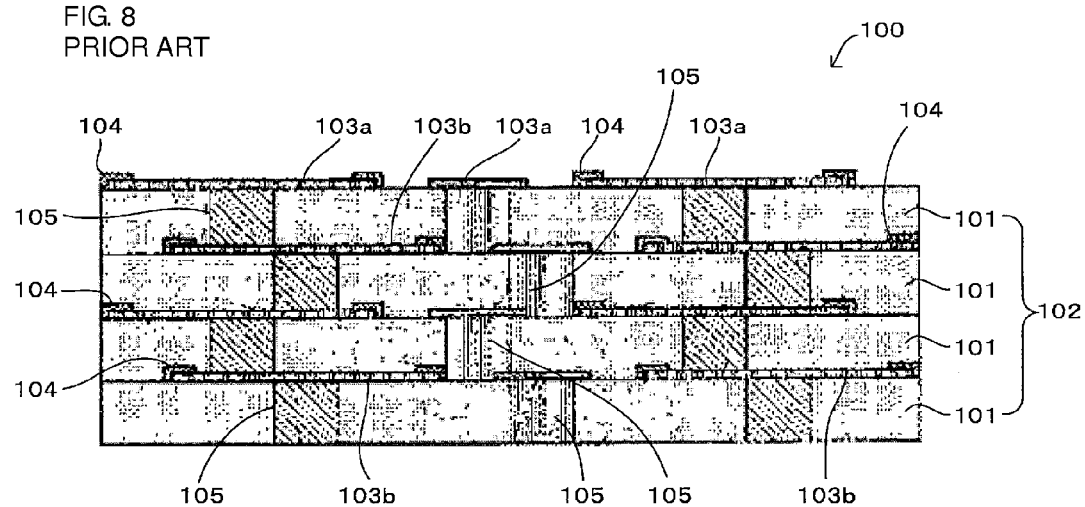
FIG. 8 is a cross-sectional view of a multilayer wiring board of the related art.

A multilayer wiring board 1a according to a second preferred embodiment of the present invention will be described with reference to FIGS. 5 to 7. FIG. 5 is a bottom view of the multilayer wiring board 1a, with the surface insulating film 8 removed. FIG. 6 is a bottom view of the multilayer wiring board 1a. FIG. 7 is a bottom view of the second insulating layer 3d from the bottom of the multilayer wiring board 1a.

The multilayer wiring board 1a of the second preferred embodiment differs from the multilayer wiring board 1 of the first preferred embodiment described with reference to FIGS. 1 to 4 in that, in addition to the via conductors 7a connected to the extending portions 5b of the ground electrode 5, a plurality of via conductors 7b are connected to the main body 5a of the ground electrode 5 as illustrated in FIG. 5. The other configuration is the same as that of the multilayer wiring board 1 of the first preferred embodiment, and thus the description of the other configuration will be omitted by assigning the same reference numerals to the corresponding components.

As illustrated in FIG. 5, the via conductors 7b (corresponding to "first interlayer connection conductors" of preferred embodiments of the present invention) connected to the main body 5a of the ground electrode 5 are arranged at the edge of the main body 5a. Thus, the via conductors 7a are arranged in the extending portions 5b of the ground electrode 5 as described above, and the via conductors 7b are arranged at the edge of the main body 5a of the ground electrode 5. Therefore, for example, the individual electrode 6a located in the upper left of FIG. 5 is surrounded by the via conductors 7a connected to the extending portions 5b on both the right and left sides of the individual electrode 6a and the via conductors 7b arranged at the edge of the main body 5a.

As illustrated in FIG. 6, the via conductors 7b, which are connected to the main body 5a of the ground electrode 5 at the edge of the main body 5a, are arranged in a region covered by the interelectrode insulating portion 8a of the surface insulating film 8. The position of each via conductor 7b is not limited to the edge of the main body 5a of the ground electrode 5, and can be appropriately changed to any position in the main body 5a as long as it is within the region covered by the interelectrode insulating portion 8a of the surface insulating film 8.

As described above, the via conductors 7b connected to the main body 5a of the ground electrode 5 are arranged at the edge of the main body 5a. Therefore, as illustrated in FIG. 7, an empty space similar to that in the multilayer wiring board 1 of the first preferred embodiment is secured in the center of the lower surface of the insulating layer 3d immediately above the lowermost insulating layer 3e.

In the second preferred embodiment, in addition to the via conductors 7a connected to the extending portions 5b of the ground electrode 5, the via conductors 7b are connected to the main body 5a of the ground electrode 5. This improves grounding performance of the ground electrode 5.

Also, the via conductors 7b are arranged at the edge of the main body 5a. Therefore, in the lower surface of the second insulating layer 3d from the bottom of the multilayer wiring board 1a, a degree of freedom in designing wiring electrodes, similar to that in the multilayer wiring board 1 of the first preferred embodiment, is ensured.

The via conductors 7b are connected to a portion of the main body 5a of the ground electrode 5, the portion being covered by the interelectrode insulating portion 8a of the surface insulating film 8. That is, since the via conductors 7b are connected to the portion where the ground electrode 5 does not easily peel off the insulating layer 3e, the connection reliability between the ground electrode 5 and the via conductors 7b is improved.

Since the via conductors 7b are arranged at the edge of the main body 5a of the ground electrode 5, a predetermined individual electrode 6a or 6b (e.g., the individual electrode 6a) is surrounded by the via conductors 7a connected to the extending portions 5b of the ground electrode 5 and the via conductors 7b connected to the main body 5a of the ground electrode 5. This improves isolation characteristics of the surrounded individual electrode 6a or 6b.

The present invention is not limited to the preferred embodiments described above, and various changes other than those described above can be made as long as they are within the scope of the present invention. For example, in the preferred embodiments described above, the individual electrodes 6a and 6b are arranged at the outer edge of the lower surface of the multilayer body 2, so as to surround substantially the entire circumference of the main body 5a of the ground electrode 5. However, the individual electrodes 6a and 6b do not necessarily need to surround the entire circumference of the main body 5a, and may be arranged in a portion of the outer edge of the lower surface of the multilayer body 2.

Also, the ground electrode 5 does not necessarily need to have the extending portions 5b.

Various preferred embodiments of the present invention are applicable to various multilayer wiring boards that include a plurality of outer electrodes on one principal surface thereof and a surface insulating film configured to prevent a short-circuit between the outer electrodes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer wiring board comprising:
a multilayer body including a plurality of insulating layers stacked on each other, the multilayer wiring board including:
a ground electrode located at a center or approximate center of one principal surface of the multilayer body;
a plurality of individual electrodes located at an outer edge of the one principal surface of the multilayer body; and
a surface insulating film including an interelectrode insulating portion and a surface covering portion, the interelectrode insulating portion covering an edge portion of the ground electrode to provide insulation between the ground electrode and each of the plurality of individual electrodes, the surface covering portion being disposed on a surface of the ground electrode to divide the ground electrode into a plurality of regions; wherein
at least a central portion of the ground electrode located at the center or the approximate center of the one principal surface of the multilayer body is exposed to an outside of the multilayer body.

2. The multilayer wiring board according to claim 1, further comprising a plurality of first interlayer connection conductors connected to the ground electrode, wherein the first interlayer connection conductors are arranged in a portion of the ground electrode that is covered by the interelectrode insulating portion.

3. The multilayer wiring board according to claim 2, wherein the first interlayer connection conductors are arranged adjacent to an edge of the ground electrode.

4. The multilayer wiring board according to claim 1, wherein the ground electrode includes a plurality of extending portions each located in a gap between adjacent ones of the plurality of individual electrodes, the extending portions extending toward an edge of the one principal surface of the multilayer body;
the multilayer wiring board further comprising a plurality of second interlayer connection conductors connected to the extending portions.

5. The multilayer wiring board according to claim 4, wherein at least one of the plurality of individual electrodes is surrounded by at least one of the first interlayer connection conductors connected to the ground electrode and at least one of the second interlayer connection conductors connected to the ground electrode.

6. The multilayer wiring board according to claim 1, further comprising a predetermined wiring pattern and a capacitive electrode configured to provide a capacitance, the wiring pattern and the capacitive electrode both being disposed inside the multilayer body, wherein both the wiring pattern and the capacitive electrode are located in a region overlapping the ground electrode in plan view of one principal surface of a predetermined one of the plurality of insulating layers.

7. The multilayer wiring board according to claim 1, wherein the ground electrode includes a main body located at the center or approximate center of the one principal surface of the multilayer body and a plurality of extending portions that extend from the main body and in a gap between adjacent ones of the plurality of individual electrodes.

8. The multilayer wiring board according to claim 7, wherein at least two of the plurality of individual electrodes surround the main body.

9. The multilayer wiring board according to claim 1, further comprising a plurality of via conductors provided in the multilayer body.

10. The multilayer wiring board according to claim 1, wherein the surface covering portion has a pattern shape defined by a combination of a horizontally extending strip pattern and vertically extending strip patterns.

11. The multilayer wiring board according to claim 7, wherein the surface covering portion divides the main body into a plurality of electrode-exposed regions having the same or substantially the same area.

12. The multilayer wiring board according to claim 11, wherein each of the plurality of electrode-exposed regions has a shape that is one of rectangular, substantially rectangular, circular and substantially circular.

13. The multilayer wiring board according to claim 7, further comprising via conductors connected to the ground electrode and located in the plurality of extending portions.

14. The multilayer wiring board according to claim 1, wherein the ground electrode defines a shielding electrode configured to prevent electromagnetic coupling between wiring electrodes.

15. The multilayer wiring board according to claim 13, further comprising via conductors connected to the main body of the ground electrode.

16. The multilayer wiring board according to claim 15, wherein the via conductors connected to the main body of the ground electrode are located in a region covered by the inter-electrode insulating portion of the surface insulating film.

17. A high-frequency module circuit comprising the multilayer wiring board according to claim 1.

18. A communication apparatus comprising the high-frequency module circuit according to claim 17.

* * * * *